US008299545B2

(12) United States Patent
Chen et al.

(10) Patent No.: US 8,299,545 B2
(45) Date of Patent: Oct. 30, 2012

(54) METHOD AND STRUCTURE TO IMPROVE BODY EFFECT AND JUNCTION CAPACITANCE

(75) Inventors: Xiangdong Chen, Poughquag, NY (US); Geng Wang, Stormville, NY (US); Da Zhang, Hopewell Junction, NY (US)

(73) Assignees: International Business Machines Corporation, Armonk, NY (US); Freescale Semiconductor, Inc., Austin, TX (US)

( * ) Notice: Subject to any disclaimer, the term of this patent is extended or adjusted under 35 U.S.C. 154(b) by 255 days.

(21) Appl. No.: 12/695,565

(22) Filed: Jan. 28, 2010

(65) Prior Publication Data

US 2011/0180883 A1 Jul. 28, 2011

(51) Int. Cl.
 *H01L 29/02* (2006.01)
(52) U.S. Cl. .......... 257/402; 257/E29.255; 257/E21.409
(58) Field of Classification Search .................. 257/402, 257/E29.255, E21.409
See application file for complete search history.

(56) References Cited

U.S. PATENT DOCUMENTS

| 6,150,676 | A | * | 11/2000 | Sasaki ........................... 257/191 |
| 6,503,805 | B2 | | 1/2003 | Wang et al. |
| 6,815,317 | B2 | | 11/2004 | Schafbauer et al. |
| 2004/0000681 | A1 | * | 1/2004 | Shinohara et al. ............ 257/290 |

* cited by examiner

*Primary Examiner* — Tan N Tran
(74) *Attorney, Agent, or Firm* — Gibb & Riley, LLC; Yuanmin Cai, Esq.

(57) ABSTRACT

A method and structure implant a first-type impurity within a substrate to form a channel region within the substrate adjacent a top surface of the substrate; form a gate stack on the top surface of the substrate above the channel region; and implant a second-type impurity within the substrate to form source and drain regions within the substrate adjacent the top surface. The channel region is positioned between the source and drain regions. The second-type impurity has an opposite polarity with respect to the first-type impurity. The method and structure implant a greater concentration of the first-type impurity, relative to a concentration of the first-type impurity within the channel region, to form a primary body doping region within the substrate below (relative to the top surface) the channel region; and to form secondary body doping regions within the substrate below (relative to the top surface) the source and drain regions.

11 Claims, 5 Drawing Sheets

Doping profile through AA'

Doping profile through AA'

METHOD AND STRUCTURE TO IMPROVE BODY EFFECT AND JUNCTION CAPACITANCE

BACKGROUND

1. Field of the Invention

The embodiments of the invention generally relate to integrated circuit structures and, more specifically, to integrated circuit transistor structures that include multiple body doping regions having different depth profiles.

2. Description of the Related Art

In conventional systems for changing threshold voltage of a transistor on a chip, the semiconductor body of the transistor can be doped with dopants by ion implantation. Control of the value of the threshold voltage is critical to good performance and low power consumption of the circuits employing the transistors. For many applications it would be desirable to control the body potential. This may usually be accomplished by changing the transistor layout to include a body contact region at the surface, which electrically connects to the body through the device width direction.

A metal oxide semiconductor field effect transistor (MOSFET) has four terminals, source, drain, gate and body/substrate. Body potential is typically ground, but can be changed. The change in body potential leads to a MOSFET threshold voltage change and this phenomenon is referred to as "body effect", or substrate effect. The amount of threshold voltage change for a certain body potential change is the body sensitivity.

The body effect describes the changes in the threshold voltage by the change in the source-bulk voltage, approximated by t:

$$V_{TN} = V_{TO} + \gamma(\sqrt{V_{SB} + 2\phi})$$

$V_{TN}$ is the threshold voltage with substrate bias present, $V_{TO}$ is the zero-$V_{SB}$ value of threshold voltage, $\gamma$ is the effect parameter, and $2\phi$ is the surface potential parameter. The body can be operated as a second gate, and is sometimes referred to as the "back gate." The body effect is sometimes referred to as the "back-gate effect."

SUMMARY

In view of the foregoing, disclosed herein is a transistor structure comprising: a substrate comprising a top surface; a channel region within the substrate adjacent the top surface, the channel region comprising a first-type impurity within the substrate; a gate stack on the top surface of the substrate, the gate stack being positioned above the channel region; source and drain regions within the substrate adjacent the top surface, the channel region being positioned between the source and drain regions, the source and drain regions comprising a second-type impurity within the substrate, the second-type impurity having an opposite polarity with respect to the first-type impurity; a primary body doping region within the substrate below, relative to the top surface, the channel region, the primary body doping region comprising a greater concentration of the first-type impurity relative to a concentration of the first-type impurity within the channel region; and secondary body doping regions within the substrate below, relative to the top surface, the source and drain regions, the secondary body doping regions comprising a greater concentration of the first type impurity relative to a concentration of the first-type impurity within the channel region.

Also disclosed is a transistor structure that comprises: a substrate comprising a top surface; a channel region within the substrate adjacent the top surface, the channel region comprising a first-type impurity within the substrate; a gate stack on the top surface of the substrate, the gate stack being positioned above the channel region; source and drain regions within the substrate adjacent the top surface, the channel region being positioned between the source and drain regions, the source and drain regions comprising a second-type impurity within the substrate, the second-type impurity having an opposite polarity with respect to the first-type impurity; a primary body doping region within the substrate below, relative to the top surface, the channel region, the primary body doping region comprising a greater concentration of the first-type impurity relative to a concentration of the first-type impurity within the channel region; and secondary body doping regions within the substrate below, relative to the top surface, the source and drain regions, the secondary body doping regions comprising a greater concentration of the first type impurity relative to a concentration of the first-type impurity within the channel region. The secondary body doping regions being separated from the primary body doping region by a portion of the substrate. The secondary body doping regions being positioned at a different depth below the top surface of the substrate than the primary body doping region.

Also disclosed is a method of forming a transistor structure comprising: implanting a first-type impurity within a substrate to form a channel region within the substrate adjacent a top surface of the substrate; forming a gate stack on the top surface of the substrate above the channel region; implanting a second-type impurity within the substrate to form source and drain regions within the substrate adjacent the top surface, the channel region being positioned between the source and drain regions, the second-type impurity having an opposite polarity with respect to the first-type impurity; and implanting a greater concentration of the first-type impurity, relative to a concentration of the first-type impurity within the channel region, to form a primary body doping region within the substrate below, relative to the top surface, the channel region; and to form secondary body doping regions within the substrate below, relative to the top surface, the source and drain regions.

Also disclosed is a method of forming a transistor structure comprising: implanting a first-type impurity within a substrate to form a channel region within the substrate adjacent a top surface of the substrate; forming a gate stack on the top surface of the substrate above the channel region; implanting a second-type impurity within the substrate to form source and drain regions within the substrate adjacent the top surface, the channel region being positioned between the source and drain regions, the second-type impurity having an opposite polarity with respect to the first-type impurity; and implanting a greater concentration of the first-type impurity, relative to a concentration of the first-type impurity within the channel region, to form a primary body doping region within the substrate below, relative to the top surface, the channel region; and to form secondary body doping regions within the substrate below, relative to the top surface, the source and drain regions. The implanting of the greater concentration of the first-type impurity causing the secondary body doping regions to be separated from the primary body doping region by a portion of the substrate. The implanting of the greater concentration of the first-type impurity causing the secondary body doping regions to be positioned at a different depth below the top surface of the substrate than the primary body doping region.

BRIEF DESCRIPTION OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

The embodiments herein provide structures and methods that increase leakage control and junction capacitance control. With the embodiments herein, that depth at which the impurities are implanted into the body is easily controlled to provide high body sensitivity without increasing junction capacitance or junction leakage. The structures and methods allow greater performance improvement and reduction in variation. This increases yield and decreases costs.

In complementary metal oxides semiconductor (CMOS) circuits, in general, higher threshold voltage means lower leakage and power consumption, but lower performance and vice versa. So, it is possible to design a portion of a circuit to have low threshold voltage for high performance, but change the body potential when the circuit is not in use to raise the threshold voltage of the sub circuit to reduce power consumption. It is beneficial to increase threshold voltage by a large amount with small body potential change, (i.e., a high body sensitivity is preferable). The embodiments herein provide precisely such a method and structure to achieve the high body sensitivity without the conventional drawbacks. Conventionally, a deep channel implant is performed prior to gate formation (a retrograde well implant). This causes two issues.

The first issue is that the dopant is at same depth under the channel and at the source/drain. The high doping at the source/drain leads to high junction leakage. The embodiments herein separate source/drain and high doping of the retrograde channel implant, thus reducing junction leakage. Secondly, there are thermal processes performed after the well implant that diffuse dopants and extend out the retrograde profile. The embodiments herein are performed significantly later, and thus see much less thermal processes and diffusion. The implant can be performed any time after gate formation until the last dopant activation anneal. It is more typically done before source/drain implant, but can certainly be done after.

Figure 1:
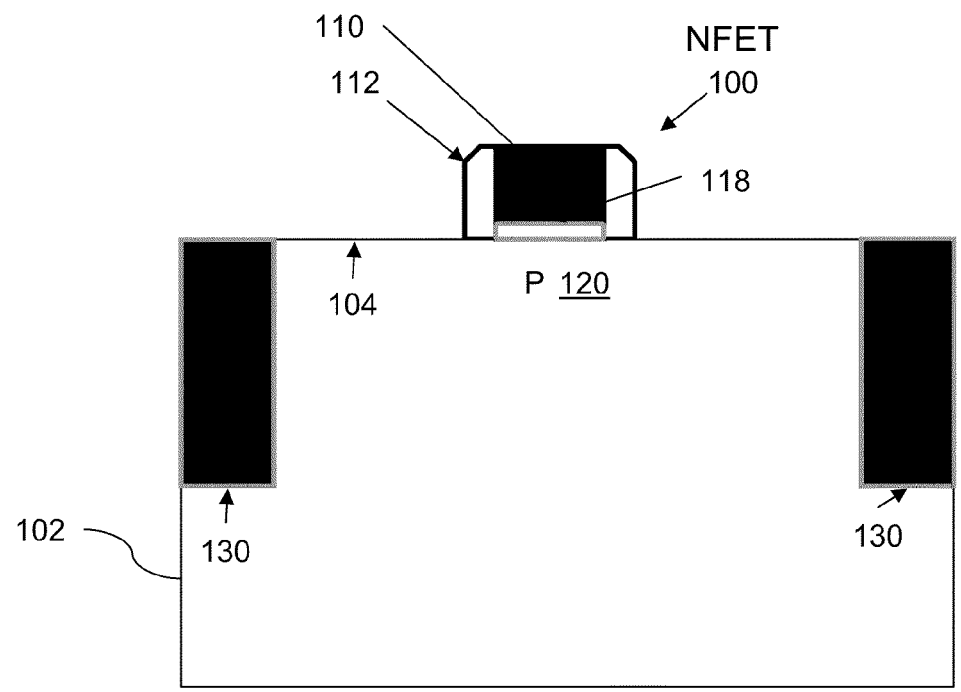
FIG. 1 is cross-sectional schematic diagram of an integrated circuit structure according to embodiments herein.

One example of the embodiments herein is shown in FIGS. 1-6. FIGS. 1-6 illustrate, in cross-sectional schematic view, the formation of an integrated circuit structure that includes a substrate 102. Generally, transistor structures are formed by depositing or implanting impurities into a substrate 102 to form at least one semiconductor channel region 120, bordered by shallow trench isolation regions 130 below the top (upper) surface 104 of the substrate 102, as shown in FIG. 1.

The substrate 102 can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. The impurities can comprises any negative-type impurity (N-type impurity, e.g., phosphorus (P), arsenic (As), antimony (Sb) etc.) or any positive-type impurity (P-type impurity, e.g., boron, indium, etc.). The channel region 120 is doped differently depending upon whether the transistor will be a positive-type or a negative-type transistor. FIG. 1 illustrates an N-type transistor 100 which includes a P-type channel 120.

The shallow trench isolation (STI) structures 130 are well-known to those ordinarily skilled in the art and are generally formed by patterning openings within the substrate and growing or filling the openings with a highly insulating material.

The method forms a gate dielectric 118 on the upper surface of the substrate 102 over the semiconductor channel region 120 and patterns a gate conductor 110 on the gate dielectric 118 over the semiconductor channel region 120, as shown in FIG. 1. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein (such as the gate conductor 110) can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

As shown in FIG. 1, the gate conductor 110 has sidewalls. The embodiments herein form sidewall spacers 112 on the sidewalls of the gate conductor 110. Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Figure 2:
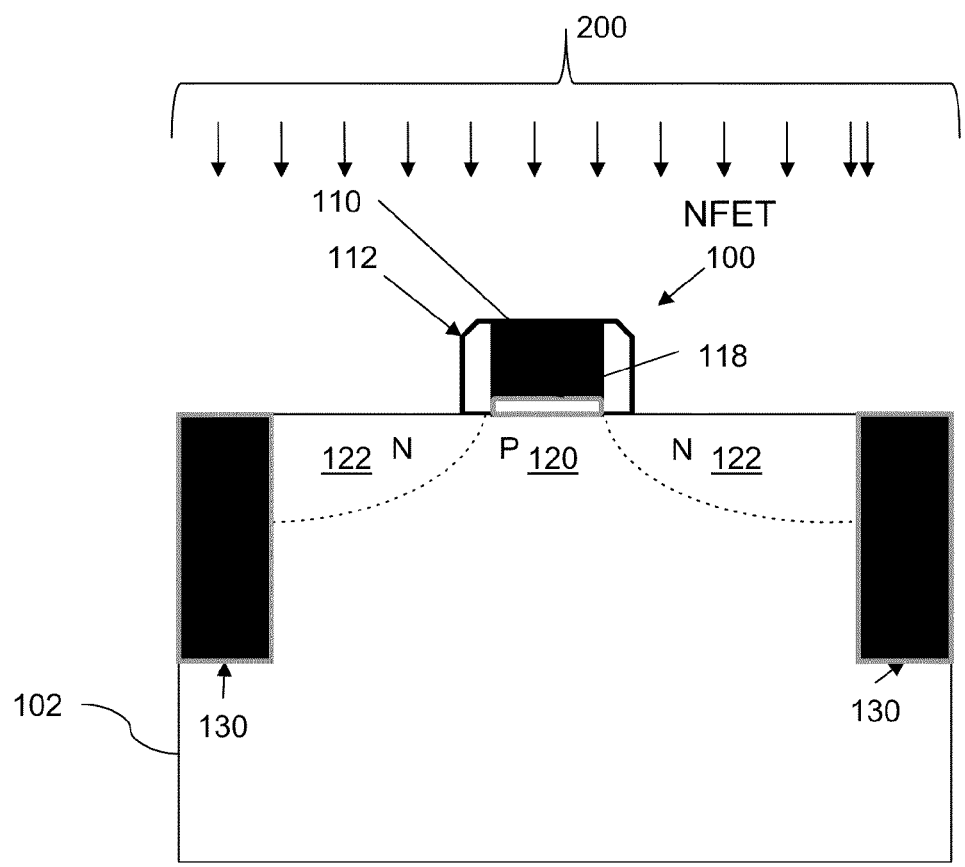
FIG. 2 is cross-sectional schematic diagram of an integrated circuit structure according to embodiments herein.

In FIG. 2, an N-type impurity 200 is implanted to form the source and drain implants 122 adjacent the top surface of the substrate. Thus, using the sidewall spacers 112 as an alignment feature, any of the impurities mentioned above are implanted into the substrate to form the source and drain regions 114. The channel region 120 is positioned between the source and drain regions 122. The second-type impurity has an opposite polarity with respect to the first-type impurity (one could be N-type and the other could be P-type).

The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques. Again, different transistors will utilizes different polarity dopants depending upon the polarity of the transistor for the source and drain regions.

Figure 3:
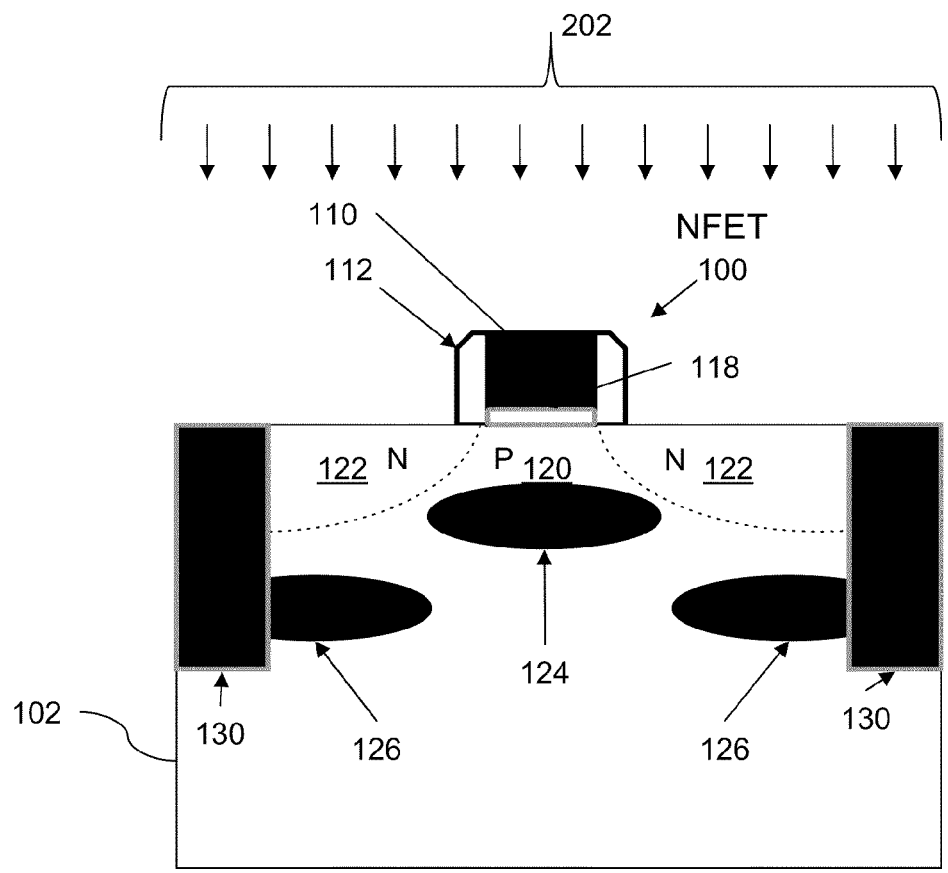
FIG. 3 is cross-sectional schematic diagram of an integrated circuit structure according to embodiments herein.

The embodiments herein then perform a second relatively deeper implant 202 as shown in FIG. 3. This deeper implant 202 implants a greater concentration of the first-type impurity, relative to the concentration of the first-type impurity that was implanted within the channel region 120. This second implant 202 forms a primary body doping region 124 within the substrate 102 below (relative to the top surface of the substrate) the channel region 120. The second implant 202 also simultaneously forms secondary body doping regions 126 within the substrate 102 below (relative to the top surface of the substrate) the source and drain regions 122. The second implantation process 202 shown in FIG. 3 can be performed according to any of the implantation techniques mentioned above, but is performed at a higher power level (higher voltage level, higher energy level) than the first implant 200 so as to implant the impurity particles deeper within the substrate and form the primary and secondary body doping regions 124, 126.

Because of the topographical shape of the gate stack 110, the second implantation process causes the secondary body doping regions 126 to be positioned at a different depth below the top surface of the substrate 102 than the primary body doping region 124. More specifically, all the implanted particles 202 will travel through approximately the same amount of material; however, because of the material within the gate stack 110, the impurity particles within the secondary body doping regions 126 are positioned at a greater depth below the top surface of the substrate 102 than the primary body doping region 124. For example, the secondary body doping regions 126 can be 2-5 times deeper (or more) within the substrate (relative to the top surface) than the primary body doping region 124. This "greater depth" corresponds directly to the amount the gate stack extends above the top surface of the substrate 102 (corresponds directly to the height of the gate stack 110) and/or corresponds directly to the different material characteristics of the gate stack 110 versus the material characteristics of the substrate 102 (different materials may have different ion implantation depths from the same power implant).

Also, because of the position of the gate stack 110, the second implantation process 202 causes the secondary body doping regions 126 to be separated from the primary body doping region 124 by a portion of the substrate 102, and also causes the secondary body doping regions 126 to be separated from the source and drain regions 122 by an area of the substrate 102. Further, the primary body doping region 124 is positioned between the secondary body doping regions 126 with respect to the left and right side of the transistor structure shown in FIG. 3.

Figure 4:
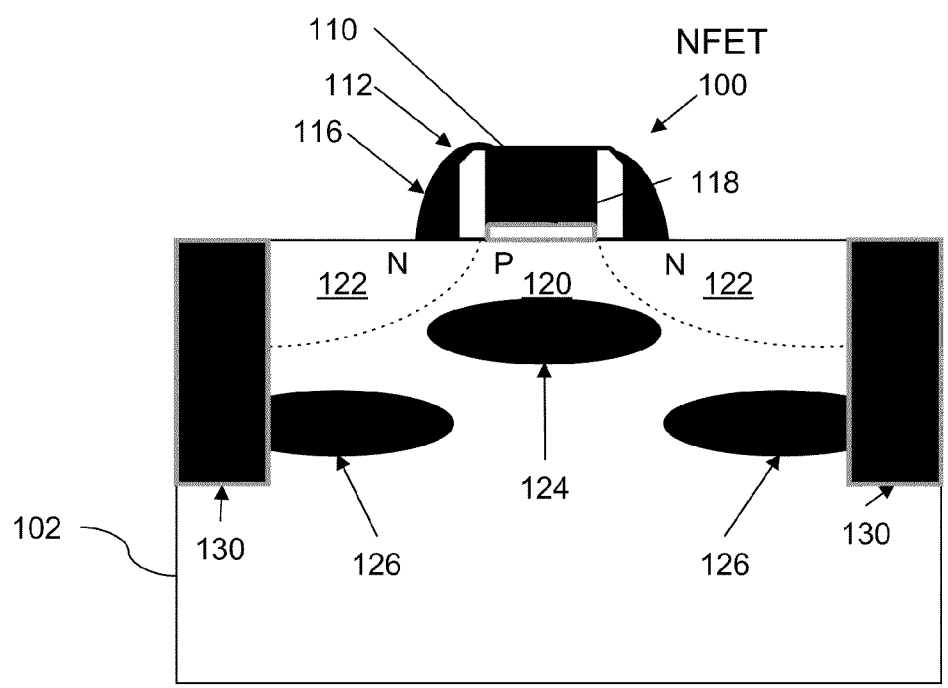
FIG. 4 is cross-sectional schematic diagram of an integrated circuit structure according to embodiments herein.
Figure 5:
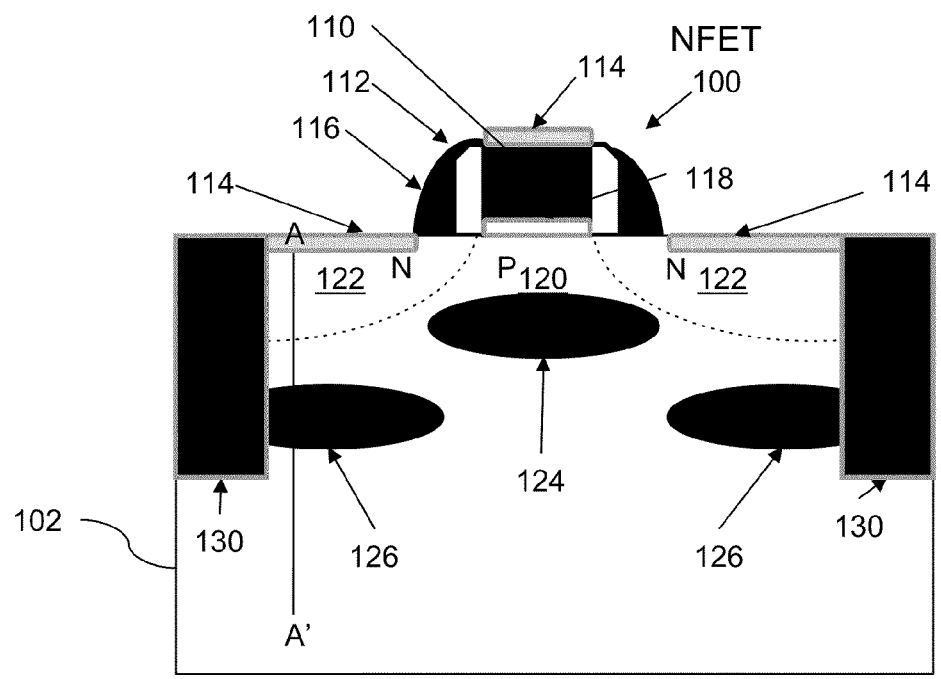
FIG. 5 is cross-sectional schematic diagram of an integrated circuit structure according to embodiments herein.

As shown in FIG. 4, additional spacers 116 can be formed on the original spacers 112 and angled halo implants can be performed if desired. As shown in FIG. 5, the exposed portions of the silicon are then silicided by depositing a metal (such as, tungsten, hafnium, tantalum, molybdenum, titanium, nickel, etc.) and then heating the structure in a thermal annealing process. This produces silicides 114 on the source and drain regions 122 and silicide 114 on the gate conductor 110.

Figure 6:
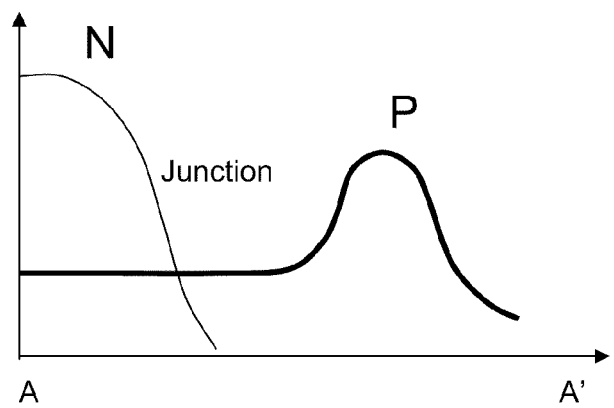
FIG. 6 is a chart illustrating doping concentrations according to embodiments herein.

FIG. 6 illustrates the doping profiles through line A-A' shown in FIG. 5. As shown, in the N-type doped source/drain region 122, the N-type impurity profile is high and as the depth is increased, the N-type impurity decreases while the P-type impurity increases in the region of the secondary body doping region 126. With the embodiments herein, that depth at which the impurities are implanted into the body is easily controlled by controlling the power level of the second implant 202 to provide high body sensitivity without increasing junction capacitance or junction leakage.

Therefore, the embodiments herein produce a transistor structure shown in FIG. 5 that comprises a substrate 102 with a top surface and a channel region 120 within the substrate 102 adjacent the top surface. The channel region 120 comprises a first-type impurity within the substrate 102. A gate stack 118, 110, 114 is on the top surface of the substrate 102. The gate stack 118, 110, 114 is positioned above the channel region 120. Further, source and drain regions 122 are within the substrate 102 adjacent the top surface. The channel region 120 is positioned between the source and drain regions 122. The source and drain regions 122 comprise a second-type impurity within the substrate 102. The second-type impurity has an opposite polarity with respect to the first-type impurity.

A primary body doping region 124 is within the substrate 102 below (relative to the top surface) the channel region 120. The primary body doping region 124 comprises a greater concentration of the first-type impurity relative to a concentration of the first-type impurity within the channel region 120. Secondary body doping regions 126 are within the substrate 102 below (relative to the top surface) the source and drain regions 122. The secondary body doping regions 126 have a greater concentration of the first type impurity relative to a concentration of the first-type impurity within the channel region 120. As shown, the secondary body doping regions 126 are separated from the primary body doping region 124 by a portion of the substrate 102. Also, the secondary body doping regions 126 are positioned at a different depth below the top surface of the substrate 102 than the primary body doping region 124. The secondary body doping regions 126 are also positioned at a greater depth below the top surface of the substrate 102 than the primary body doping region 124. The greater depth corresponds to the amount the gate stack 118, 110, extends above the top surface of the substrate 102. Further, the secondary body doping regions 126 are separated from the source and drain regions 122 by an area of the substrate 102. In addition, the primary body doping region 124 is positioned between the secondary body doping regions 126.

Figure 7:
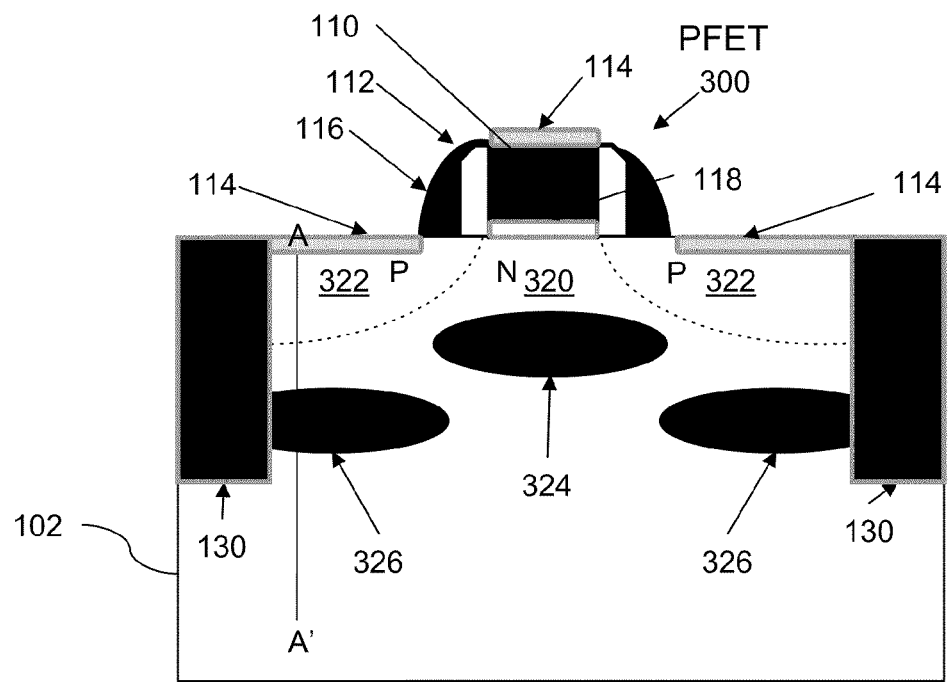
FIG. 7 is cross-sectional schematic diagram of an integrated circuit structure according to embodiments herein.
Figure 8:
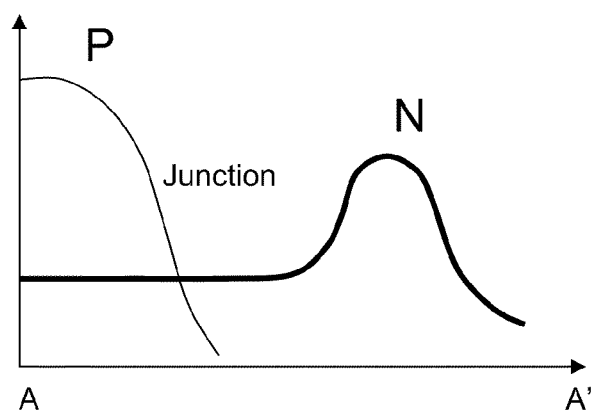
FIG. 8 is a chart illustrating doping concentrations according to embodiments herein.

While the above-description has utilized an N-type field effect transistor (NFET) 100 as an exemplary embodiment, those ordinarily skilled in the art would understand that the invention is not limited to this single embodiment. As another example, FIGS. 7 and 8 illustrates a P-type field effect transistor (PFET) 300. The elements that are the same as those discussed above are given the same identification numerals in FIG. 7. The differences in FIG. 7 are that the channel region 320 has an N-type doping instead of the P-type doping of channel region 120; the source and drain regions 322 have a P-type doping instead of the N-type doping of source and drain regions 122; and the primary and secondary body doping regions 324 and 326 have N-type doping instead of the P-type doping of primary and secondary body doping regions 124 and 126. Further, the doping profiles in FIG. 8 are the opposite of those shown in FIG. 6.

While only one of each type of transistor is illustrated in the drawings, those ordinarily skilled in the art would understand that many of each type of transistor could be formed and the drawings are intended to show multiple ones of each of the different types of transistors; however, the drawings have been simplified to only show a single transistor of each type for clarity and to allow the reader to more easily recognize the different features illustrated. This is not intended to limit the invention because, as would be understood by those ordinarily skilled in the art, the invention is applicable to structures that include many of each type of transistor.

Figure 9:
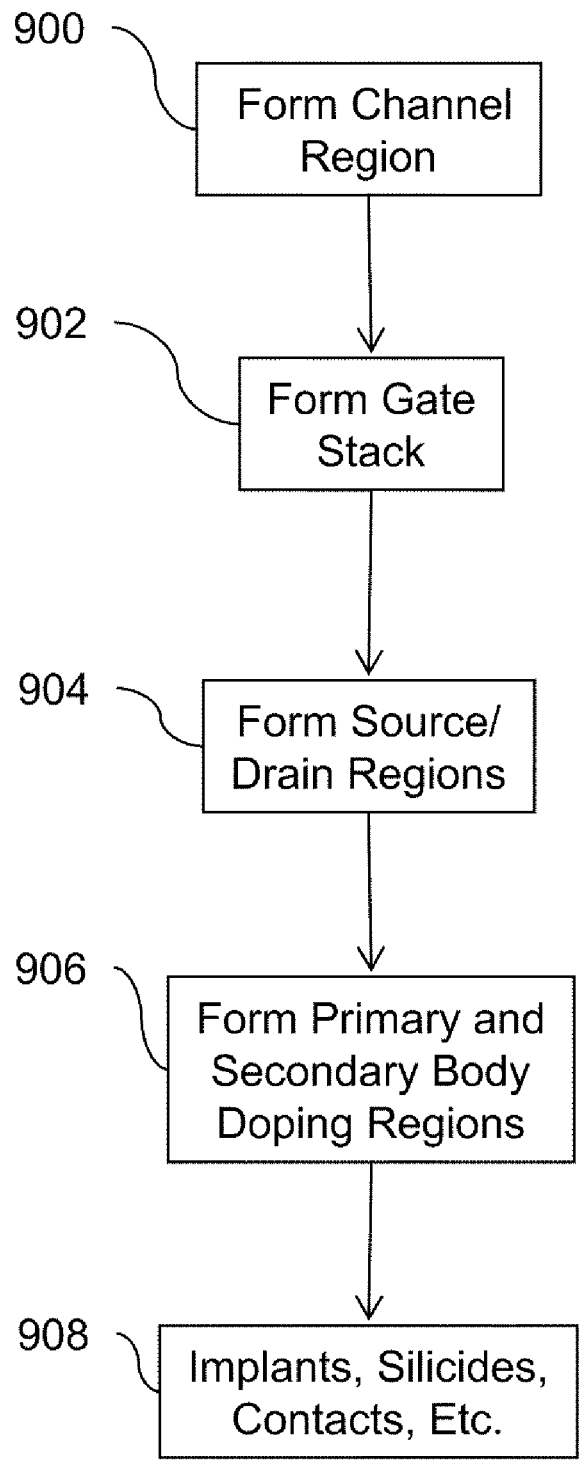
FIG. 9 is a flow diagram illustrating method embodiments herein.

FIG. 9 illustrates a method embodiment herein in flowchart form. In item 900, the method implants a first-type impurity within a substrate to form a channel region within the substrate adjacent a top surface of the substrate. Then, in item 902, the method forms a gate stack on the top surface of the substrate above the channel region. In item 904, the method implants a second-type impurity within the substrate to form source and drain regions within the substrate adjacent the top surface. This process positions the channel region between the source and drain regions. Again, the second-type impurity has an opposite polarity with respect to the first-type impurity.

In item 906, the method implants a greater concentration of the first-type impurity, relative to a concentration of the first-type impurity within the channel region, to form a primary body doping region within the substrate below (relative to the top surface) the channel region; and to form secondary body doping regions within the substrate below (relative to the top surface) the source and drain regions. In item 908, the additional implants, silicides, and contacts are formed to complete the transistor structure.

Therefore, as shown above, the embodiments herein provide structures and methods that increase leakage control and junction capacitance control. With the embodiments herein, that depth at which the impurities are implanted into the body is easily controlled to provide high body sensitivity without increasing junction capacitance or junction leakage. The structures and methods allow greater performance improvement and reduction in variation. This increases yield and decreases costs.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A transistor structure comprising:
a substrate comprising a top surface;
a channel region within said substrate adjacent said top surface, said channel region comprising a first-type impurity within said substrate;
a gate stack on said top surface of said substrate, said gate stack being positioned above said channel region;
source and drain regions within said substrate adjacent said top surface, said channel region being positioned between said source and drain regions, said source and drain regions comprising a second-type impurity within said substrate, said second-type impurity having an opposite polarity with respect to said first-type impurity;
a primary body doping region within said substrate below, relative to said top surface, said channel region, said primary body doping region being positioned between said source and drain regions within each said transistor structure, and said primary body doping region comprising a greater concentration of said first-type impurity relative to a concentration of said first-type impurity within said channel region; and
secondary body doping regions within said substrate below, relative to said top surface, said source and drain regions, said secondary body doping regions comprising a greater concentration of said first type impurity relative to a concentration of said first-type impurity within said channel region,
said secondary body doping regions being positioned at a greater depth below said top surface of said substrate than said primary body doping region.

2. The transistor structure according to claim 1, said greater depth corresponding to an amount said gate stack extends above said top surface of said substrate.

3. The transistor structure according to claim 1, said secondary body doping regions being separated from said source and drain regions by an area of said substrate.

4. The transistor structure according to claim 1, said primary body doping region being positioned between said secondary body doping regions, within each said transistor structure.

5. A transistor structure comprising:
a substrate comprising a top surface;

a channel region within said substrate adjacent said top surface, said channel region comprising a first-type impurity within said substrate;

a gate stack on said top surface of said substrate, said gate stack being positioned above said channel region;

source and drain regions within said substrate adjacent said top surface, said channel region being positioned between said source and drain regions, said source and drain regions comprising a second-type impurity within said substrate, said second-type impurity having an opposite polarity with respect to said first-type impurity;

a primary body doping region within said substrate below, relative to said top surface, said channel region, said primary body doping region being positioned between said source and drain regions within each said transistor structure, and said primary body doping region comprising a greater concentration of said first-type impurity relative to a concentration of said first-type impurity within said channel region; and secondary body doping regions within said substrate below, relative to said top surface, said source and drain regions, said secondary body doping regions comprising a greater concentration of said first type impurity relative to a concentration of said first-type impurity within said channel region, said secondary body doping regions being separated from said primary body doping region by a portion of said substrate, and said secondary body doping regions being positioned at a greater depth below said top surface of said substrate than said primary body doping region.

6. The transistor structure according to claim 5, said greater depth corresponding to an amount said gate stack extends above said top surface of said substrate.

7. The transistor structure according to claim 5, said secondary body doping regions being separated from said source and drain regions by an area of said substrate.

8. The transistor structure according to claim 5, said primary body doping region being positioned between said secondary body doping regions, within each said transistor structure.

9. A transistor structure comprising:

a substrate comprising a top surface;

a channel region within said substrate adjacent said top surface, said channel region comprising a first-type impurity within said substrate;

a gate stack on said top surface of said substrate, said gate stack being positioned above said channel region;

source and drain regions within said substrate adjacent said top surface, said channel region being positioned between said source and drain regions, said source and drain regions comprising a second-type impurity within said substrate, said second-type impurity having an opposite polarity with respect to said first-type impurity;

a primary body doping region within said substrate below, relative to said top surface, said channel region, said primary body doping region being positioned between said source and drain regions within each said transistor structure, and said primary body doping region comprising a greater concentration of said first-type impurity relative to a concentration of said first-type impurity within said channel region; and secondary body doping regions within said substrate below, relative to said top surface, said source and drain regions, said secondary body doping regions comprising a greater concentration of said first type impurity relative to a concentration of said first-type impurity within said channel region, said secondary body doping regions being positioned at a greater depth below said top surface of said substrate than said primary body doping region, and said greater depth corresponding to an amount said gate stack extends above said top surface of said substrate.

10. The transistor structure according to claim 9, said secondary body doping regions being separated from said source and drain regions by an area of said substrate.

11. The transistor structure according to claim 9, said primary body doping region being positioned between said secondary body doping regions, within each said transistor structure.

* * * * *